US008563929B2

(12) United States Patent
Vizgaitis

(10) Patent No.: US 8,563,929 B2
(45) Date of Patent: Oct. 22, 2013

(54) SIMULTANEOUS DUAL BAND DUAL FOV IMAGING SYSTEM

(75) Inventor: Jay N. Vizgaitis, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 348 days.

(21) Appl. No.: 12/822,548

(22) Filed: Jun. 24, 2010

(65) Prior Publication Data

US 2011/0315878 A1    Dec. 29, 2011

(51) Int. Cl.
*H01L 27/146* (2006.01)

(52) U.S. Cl.
USPC ........................................................ 250/332

(58) Field of Classification Search
USPC ........................................................ 250/332
See application file for complete search history.

(56) References Cited

U.S. PATENT DOCUMENTS

| 5,512,750 | A | 4/1996 | Yanka et al. |
| 5,751,473 | A * | 5/1998 | Runciman ..................... 359/356 |
| 7,570,404 | B2 * | 8/2009 | Li et al. ........................... 359/15 |
| 2002/0068020 | A1 * | 6/2002 | Stuckey ..................... 422/82.08 |
| 2004/0021852 | A1 | 2/2004 | DeFlumere |
| 2010/0321808 | A1 * | 12/2010 | Bentley et al. ................ 359/859 |

OTHER PUBLICATIONS

Jay Vizgaitis, Jason Miller, John Hall and Dan Berube, "Third-Generation FLIR Demonstrator", Proc. SPIE 6940, 69400U (2008); <doi:10.1117/12.779121> Downloaded Jul. 3, 2012.*
Vizgaitis, J.N., "Third generation infrared optics," Infrared Technology and Applications XXXIV, Proc. of SPIE vol. 6940 69400S-1, 2008.

* cited by examiner

*Primary Examiner* — Constantine Hannaher
(74) *Attorney, Agent, or Firm* — Richard J. Kim

(57) ABSTRACT

A two fields-of-view system has both fields of view imaged simultaneously to the same image plane. For example, an optical system comprising of two or more FOV where a common dual band focal plane array is used in order to image both spectral bands independently. Each spectral band is passed through a common imager, but split off by a beam splitter so that each spectral band sees a different field of view centered at the same point. The two fields of view are separated spectrally but enabled to be imaged simultaneously due to the spectral separation of the focal plane array and the use of a beam splitter. Such a system allows viewing two fields of view simultaneously.

12 Claims, 4 Drawing Sheets

SIMULTANEOUS DUAL BAND DUAL FOV IMAGING SYSTEM

GOVERNMENT INTEREST

The invention described herein may be manufactured, used, sold, imported, and/or licensed by or for the Government of the United States of America.

FIELD OF THE INVENTION

This invention relates in general to optical imaging systems, and more particularly, to dual-band, dual fields-of-view imaging systems.

BACKGROUND OF THE INVENTION

With the development of dual-band focal plane arrays (FPA), it is now possible to image two different spectral bands on the same FPA at the same time. These FPAs include a simultaneous read-out capability enabling imagery from both spectral bands to be viewed at the same time. These dual-band FPA's are known to image long-wave infrared (LWIR) and mid-wave infrared (MWIR) bands, or two different bands from the MWIR (e.g. 3.5-4.0 and 4.3-5.1 microns).

SUMMARY OF THE INVENTION

Such a potential to combine different desired spectral bands on dual-band focal plane arrays (FPA) can be exploited, e.g., to read them out simultaneously. Such FPA types can be different from broadband FPA's in that a separate image is produced for each spectral band versus a broadband FPA that would produce a single image comprising of all the spectral bands. These FPA types as disclosed can enable various configurations of optical systems and developing system structures.

In one aspect, different imaging spectral bands can be utilized in order to image two different fields of view (FOV) simultaneously instead of having to switch between FOVs every time a different magnification is desired. This can allow utilization of a narrow field of view (NFOV) and wide field of view (WFOV) simultaneously, offering situational awareness while interrogating a target.

An optical system has two or more FOVs where a common dual-band focal plane array is used in order to image both spectral bands independently. Each spectral band is passed through a common imager, but the optical system is based on a beam splitter so that each spectral band sees a different field of view centered at a common point. This enables a system that sees two fields of view simultaneously.

In one exemplary embodiment, an optical system having multiple fields of view is disclosed. Such an optical system comprises an afocal device having a magnification value to optically direct a first spectral band of a first field of view; a beam splitter disposed to reflect the directed first spectral band from said afocal device and transmit a second spectral band of a second field of view in a common optical path having a common line of sight; a dual-band imager with an associated focal length disposed in said common optical path of said reflected first spectral band and said transmitted second spectral band to further direct a focused optical image of both the first spectral band of a first field of view and the second spectral band of a second field of view; and a dual-band detector disposed to receive said focused optical image, a common dual-band focal plane array being used to image said focused optical image of both the first spectral band of a first field of view and the second spectral band of a second field of view of a common line of sight. A magnification difference between said two fields of view relates to the magnification value of the afocal device.

In another exemplary embodiment, an optical system for dual-band infrared use is disclosed. Such an optical system comprises an afocal arrangement comprising an off-axis primary mirror that has a parabolic curvature and reflects a collimated light from across a field-of-view onto a secondary mirror, and a fold mirror followed by a tertiary mirror, wherein said secondary mirror reflects light onto said fold mirror, and wherein a light that is reflected from the tertiary mirror is collimated with a pupil diameter that is scaled by a magnification of said afocal arrangement; a beam splitter from which said collimated light from said afocal arrangement is reflected, said beam splitter being configured with respect to separate spectral bands, each of respective field of view, said beam splitter capable of passing light from other spectral band based on transmission properties of the beam splitter, such that the spectral bands resulting from said beam splitter follow a common path; a dual-band imager configured with respect to said beam splitter to image said spectral bands onto a common image plane, wherein said dual-band imager comprises six various lenses that are configured to provide a common image plane and a focal length through said imager for MWIR and LWIR bands; and at least one of a plane parallel window and an aperture stop disposed in an optical path towards said common image plane.

BRIEF DESCRIPTION OF THE DRAWINGS

Additional advantages and features will become apparent as the subject invention becomes better understood by reference to the following detailed description when considered in conjunction with the accompanying drawings wherein.

DETAILED DESCRIPTION

A detailed description of the various exemplary embodiments of the disclosure follows hereinafter.

An optical system comprising two or more FOV where a common dual-band focal plane array (FPA) is used in order to image both spectral bands independently. Each spectral band is passed through a common imager, but the optical system is based on a beam splitter so that each spectral band sees a different field of view centered at the same point. This enables a system that sees two fields of view simultaneously.

For example, with the use of a dual-band FPA, an exemplary optical system can have the capability to image both spectral bands simultaneously at the same image plane while reading out the collected image to different outputs. Such an optical system is comprised of at least an afocal, an imager, and a beam splitter that will be used to split the two spectral bands between the afocal and a imager. The imager is configured to simultaneously image both spectral bands to the same image plane.

Figure 1:
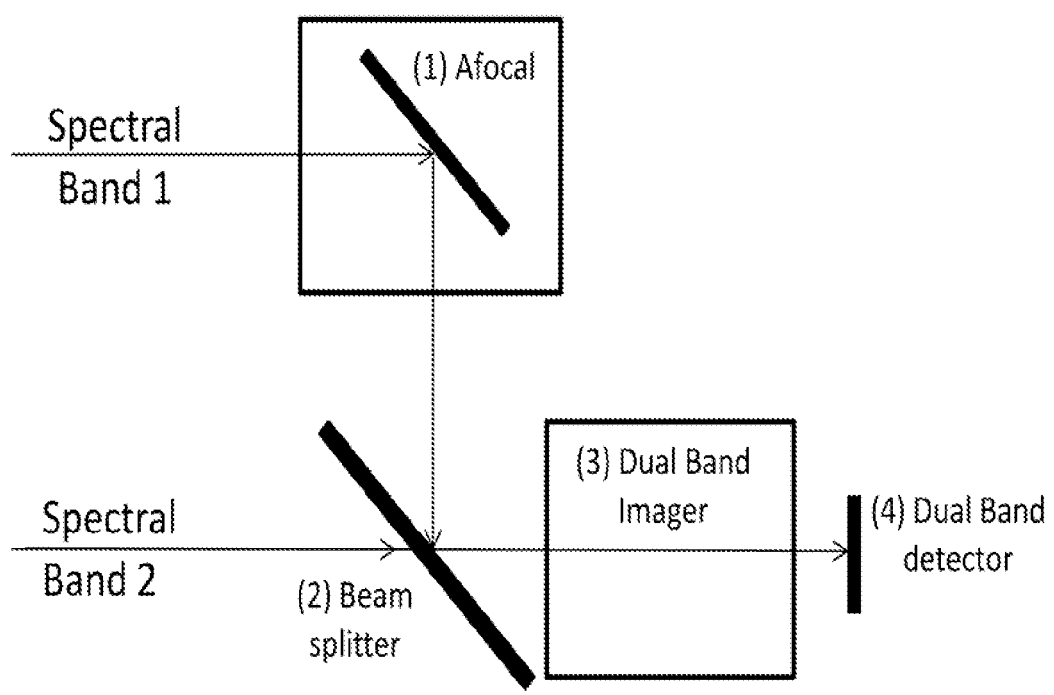
FIG. 1 shows a block diagram of an exemplary simultaneous multiple fields of view spectrally separated system.

One exemplary implementation of this system (e.g., FIG. 1) would be for the photons from spectral band 1 to be imaged through an afocal device (1) and reflect off of the beam splitter (2) into the imager and focus onto the dual band detector (4). Such an exemplary embodiment results in field of view 1 of the system where the focal length is determined by the multiplication of the magnification of the afocal device with the focal length of the imager. The second field of view is determined by the imager focal length and constructed by the photons of spectral band 2 which are transmitted directly through the beam splitter (2) to a common path as with spectral band 1 as it is imaged through the dual band imager (3) onto the dual band detector (4). The FPA will thus be imaging simultaneously the two different fields of view created by the two different spectral bands of the same line of sight. The magnification difference between the two FOV is then the magnification of the afocal device.

Figure 2:
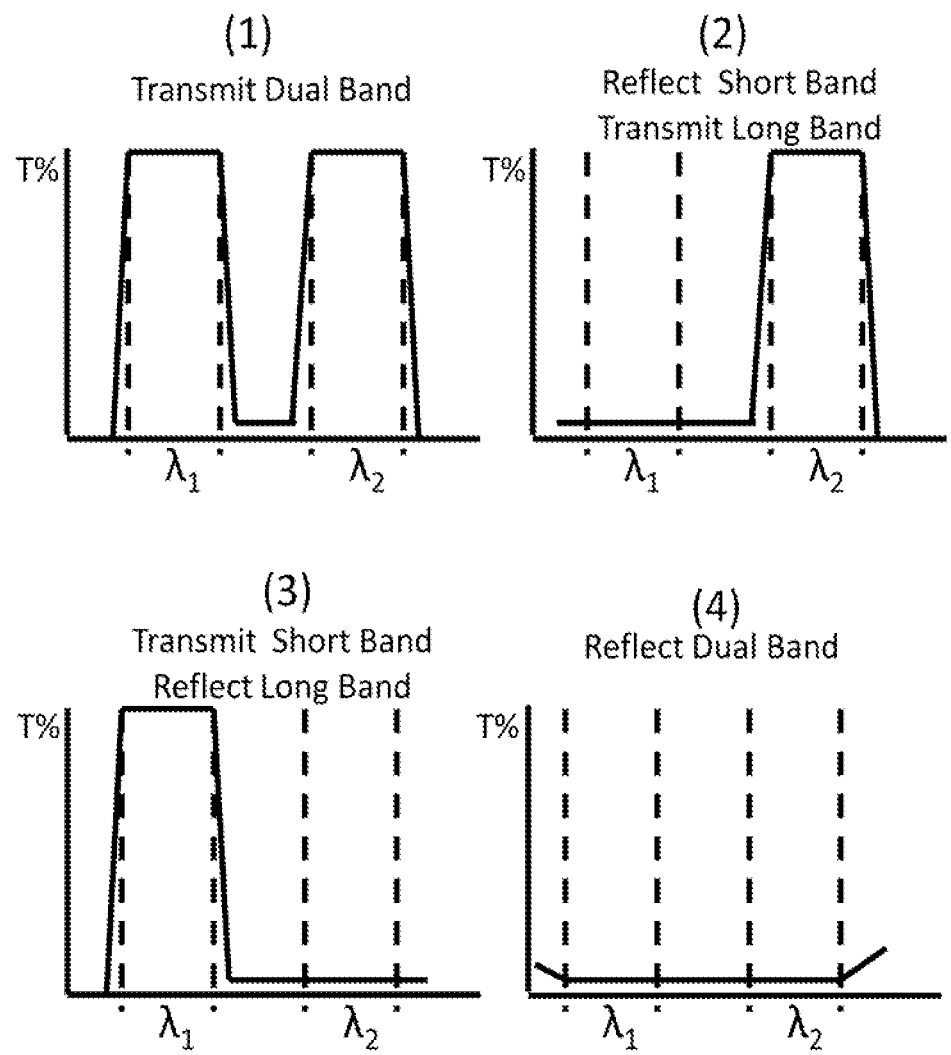
FIG. 2 shows exemplary beam splitter spectral band properties for various exemplary configurations of the system.

The inclusion of a switchable beam splitter creates a quad-modal imaging device where the spectral bands pass through different optical paths depending on the mode of the beam splitter. The four potential modes of the beam splitter are shown in FIG. 2. They are 1) reflect spectral band 1 while transmitting spectral band 2, 2) transmit spectral band 1 while reflecting spectral band 2, 3) reflect spectral band 1 and 2, and 4) transmit spectral bands 1 and 2. The first configuration results in the block diagram as observed in FIG. 1. Configuration 2 reverses the spectral path resulting in spectral band 2 being the magnified image since it passes through the afocal device. Configuration 3 changes the system from having two spectrally based fields of view to both spectral bands having the same magnified field of view as both spectral bands now pass through the afocal device. Configuration 4 transmits both spectral bands through the beam splitter thus both spectral bands have the same field of view, which is the non-magnified field of view.

Methods of changing this beam splitter include either the use of a mechanical device or an electronically switchable beam splitter. The mechanical device could be a device such as a wheel 400 that comprises of up to four beam splitters (401-404) to create the desired configurations. The desired beam splitter is then moved into the optical path to perform the desired spectral selection. The electronically switchable beam splitter can be achieved via a device such as a spectrally selective liquid crystal device or an electro-chromic device, e.g., as shown as (2) beam splitter in FIG. 1, where an electrical signal is provided to the beam splitter changing the spectral properties to match those of the four configurations.

Figure 3:
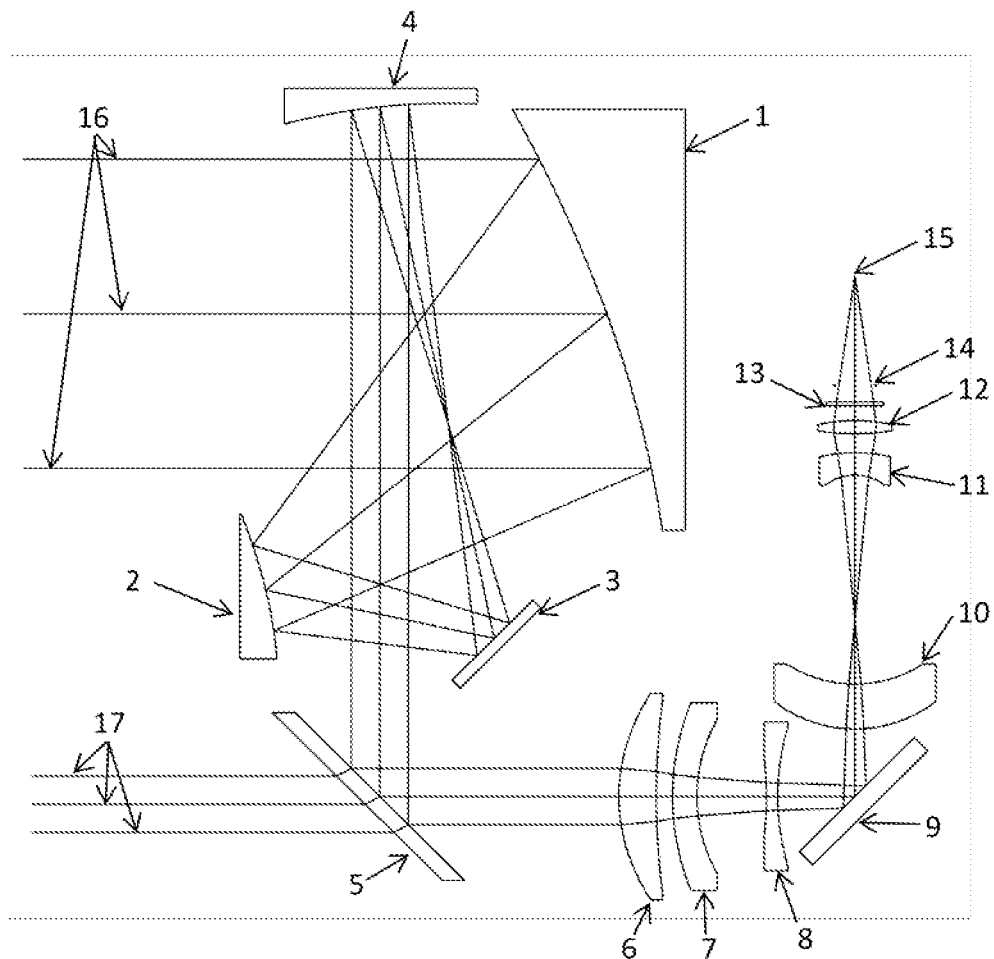
FIG. 3 shows an exemplary optical configuration of a MWIR/LWIR two field of view system where both fields of view can be seen at the same time.
Figure 4:
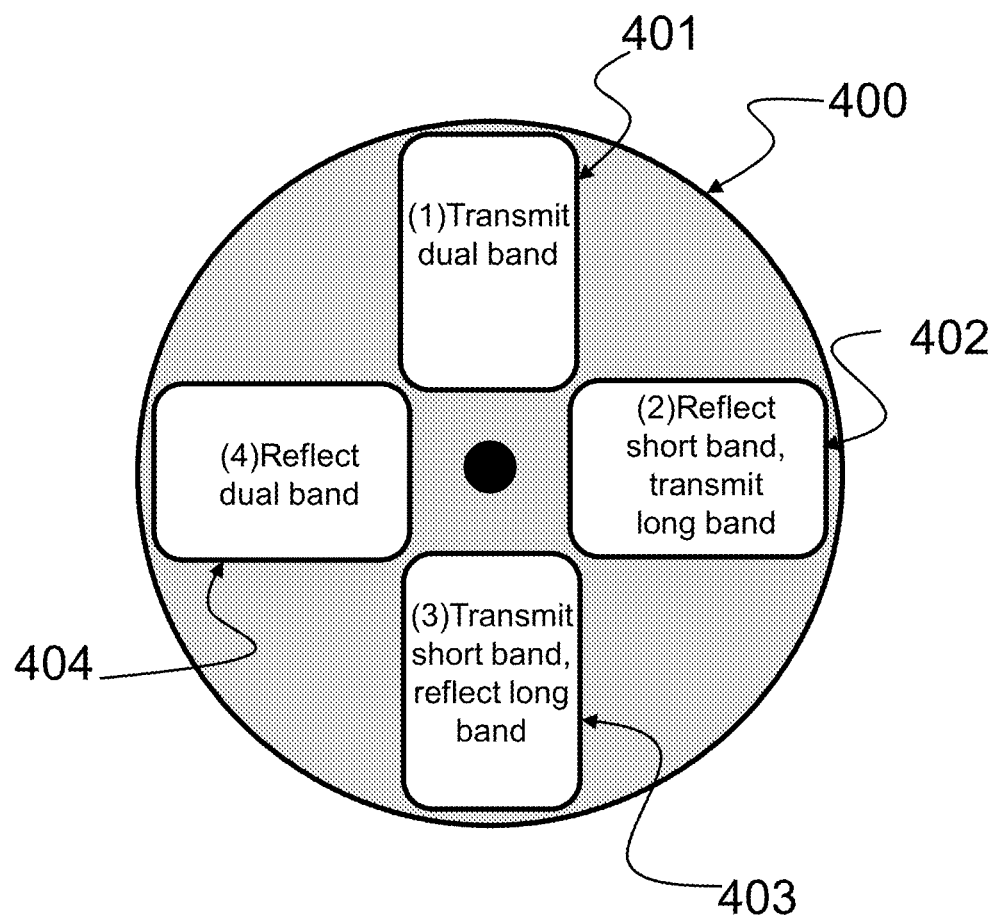
FIG. 4 depicts an exemplary mechanically switchable beam splitter.

The optical configuration in FIG. 3 shows an exemplary embodiment of such a system for dual-band infrared use. The configuration is exemplified for a dual band MWIR and LWIR system utilizing a dual band focal plane array that images those two spectral bands independently, but at the same image plane (15). An afocal assembly is comprised of four mirrors: an off-axis primary mirror (1) that has a parabolic curvature and reflects the collimated light from across the field-of-view onto the secondary mirror (2). This mirror is a hyperboloid and also an off-axis mirror. It reflects the light onto a fold mirror (3) that is planar and has no power. Its sole purpose is to redirect the light to package the afocal assembly into a more compact fashion. The fold mirror (3) is followed by the tertiary mirror (4) which is another off-axis paraboloid. The resulting light that is reflected from the tertiary mirror (4) is collimated with a pupil diameter that is scaled by the magnification of this afocal assembly. This afocal assembly provides a 5.5 magnification ratio. Such a configuration could be used to provide a different magnification value through the afocal assembly to achieved the desired magnification change between the fields of view. The afocal exit pupil is designed to be located in the air gap between the secondary (2) and fold mirror (3) after reflecting off of the tertiary mirror (4) to minimize the footprint between those two surfaces to eliminate potential vignetting. Such an afocal assembly can be configured to be off-axis to eliminate any obscuration that would occur due to the reflected ray of an on-axis design. Any obscuration would have a negative impact on the diffraction limited performance of the system due to diffraction around the obscuration. This is a significant impact in the MWIR and LWIR.

The collimated light from the afocal assembly is reflected off of the beam splitter (5) that is designed to separate the spectral bands between the field of view and enable them to be imaged onto the common image plane (15) via the same dual band imager. This beam splitter (5) also passes the light from the other spectral band, depending on the transmission properties of the beam splitter, so that it will follow a common path through the imager. The imager consists of six lenses of differing materials that are designed specifically to provide a common image plane and focal length through the imager for both the MWIR and LWIR. The first imager lens (6) is a zinc selenide lens that has an aspheric curvature on the first surface. The second imager lens (7) is a germanium lens with a spherical curvature on both surfaces. The third imager lens (8) is a barium fluoride lens, also with spherical curvature on both sides. This lens is followed by a fold mirror (9) in the imager used to minimize the overall footprint of the optical system. It is followed by the fourth imager lens (10), another germanium lens, this one having an aspheric curvature on its first surface, and a spherical curvature on the second surface. An intermediate image plane is formed between this fourth imager lens (10) and the fifth imager lens (11), a barium fluoride lens with spherical curvatures. The lens is design to have an intermediate image plane so that it can be a reimaging lens and have two pupils.

The first pupil can be located at the aperture stop of the system (14), and the second can be reimaged to be at the location of the exit pupil of the afocal assembly. This pupil is the entrance pupil of the imager and can be located in front of the lens. This pupil location also aids in minimizing the size of the beam splitter, and enables all of the rays from across the field of view to make it through the entire optical system without vignetting. The sixth and final imager lens (12) is a zinc selenide lens with an aspheric curvature on its first surface, and a spherical surface on the second surface. This lens bends the rays to form the final image at the image plane (15). Between the sixth lens (12) and the image plane (15) lie two more optical components of importance. A plane parallel window (13) is required due to the nature of the type of system. Since this is a dual band MWIR and LWIR image plane, the detector will have to reside inside of a vacuum dewar so that the detector can be cooled down to cryogenic temperatures. This requires this infrared transparent window that can be made from a number of materials. Following the window and within this cryogenic dewar space is an aperture stop (14) which is commonly referred to as the cold stop due to it being an aperture stop in the cold temperature. This component is used to control the stray light that reaches the detector and defines the solid angle of light that passes through the optical system across the field of view.

Finally, at the image plane an image is formed from both the LWIR and MWIR at the same plane to within the depth of focus of each spectral band. The resulting image is dependent on the spectral properties of the beam splitter. The system can be configured so that the beam splitter is a fixed component, is moved mechanically, or controlled electronically to change its transmission properties.

If the beam splitter is fixed, then it is designed to operate in either configuration 2 or 3 from FIG. 2. In the nominal design, the beam splitter transmits the LWIR and reflects the MWIR. In this configuration, the MWIR on-axis optical rays (16) pass through the afocal, reflect off the beam splitter (5), and transmit through the imager to the image plane (15) to form a MWIR image based on the focal length of the imager magnified by the 5.5× afocal. The LWIR on-axis optical rays (17) transmit through the beam splitter (5) into the imager, and onto the image plane (15) where it forms an image based on the focal length of the imager only. Since the focal plane array is designed to readout the spectral bands independently, the fact that each image is different does not impact the content or quality of either image. The result is that the system now is capable of displaying two images at the same time. The LWIR image is the wide field of view with a field of view determined by the focal length of the imager and the size of the focal plane array. The MWIR image is the narrow field of view image and is magnified by the power of the afocal, which in this case is 5.5×. This field of view is thus 5.5 times narrower than that of the LWIR wide field of view. Alternatively, the spectral band of the beam splitter could be different so that the MWIR is the wide field of view and the LWIR is the narrow field of view.

If a switchable beam splitter is employed, then the spectral bands could represent either field of view at any given time as determined by the user. This method also has the benefit that the beam splitter could be switched so that both bands could provide the same field of view simultaneously by using configuration 1 or 4 from FIG. 2. If configuration 1 is used, then both spectral bands transmit through the beam splitter and are thus both in the wide field of view. If configuration 4 is used, then both spectral bands reflect off the beam splitter and are thus in the narrow field of view as they pass through the afocal.

It is obvious that many modifications and variations of the present invention are possible in light of the above teachings. It is therefore to be understood that within the scope of the appended claims, the invention may be practiced otherwise than as described.

What is claimed is:

1. An optical system for dual-band infrared use, comprising:
    an afocal arrangement comprising an off-axis primary mirror that has a parabolic curvature and reflects a collimated light from across a field-of-view onto a secondary mirror, and a fold mirror followed by a tertiary mirror, wherein said secondary mirror reflects light onto said fold mirror, and wherein a light that is reflected from the tertiary mirror is collimated with a pupil diameter that is scaled by a magnification of said afocal arrangement;
    a rotatable wheel device having a plurality of selectable beam splitters, each beam splitter having respective transmission and reflection properties with respect to two separate spectral bands, wherein one selectable beam splitter reflects a spectral band of said collimated light from said afocal arrangement when rotated into alignment, said beam splitter transmitting collimated light of another spectral band such that the spectral bands resulting from said beam splitter follow a common path;
    a dual-band imager configured with respect to said beam splitter to image said spectral bands onto a common image plane, wherein said dual-band imager comprises six various lenses that are configured to provide a common image plane and a focal length through said imager for MWIR and LWIR bands;
    at least one of a plane parallel window and an aperture stop disposed in an optical path towards said common image plane; and
    a dual-band focal plane array capable of imaging said two spectral bands independently and simultaneously in relation to said common image plane, rendering said optical system suitable as a dual-band MWIR and LWIR system that simultaneously images both spectral bands as different fields of view, wherein said rotatable wheel device is capable of switching the spectral bands to render the said optical system suitable to image both spectral bands simultaneously with the same field of view.

2. The optical system according to claim 1, wherein said rotatable wheel device has four selectable beam splitters, one capable of reflecting both MWIR and LWIR spectral bands, another capable of transmitting the MWIR and reflecting the LWIR spectral bands, yet another capable of transmitting the LWIR and reflecting the MWIR spectral bands, and the last capable of transmitting both the MWIR and LWIR spectral bands.

3. The optical system according to claim 1, wherein said secondary mirror of said afocal arrangement is a hyperboloid, also an off-axis mirror, wherein said fold mirror is planar and has no power, and wherein said tertiary mirror is another off-axis paraboloid.

4. The optical system according to claim 1, wherein said afocal arrangement provides about 5.5 magnification ratio but is capable of providing a different magnification value to achieve a desired magnification change between the fields of view, and wherein an afocal exit pupil can be disposed in an air gap between the secondary mirror and the fold mirror after reflecting off of the tertiary mirror to reduce a footprint and/or avoid potential vignetting.

5. The optical system according to claim 1, wherein said six various lenses comprises:
    a first imager lens comprising a zinc selenide lens that has an aspheric curvature on the first surface;
    a second imager lens comprising a germanium lens with a spherical curvature on both surfaces;
    a third imager lens comprising is a barium fluoride lens, also with spherical curvature on both sides;
    a fourth imager lens comprising another germanium lens, this one having an aspheric curvature on its first surface, and a spherical curvature on the second surface;
    a fifth imager lens comprising a barium fluoride lens with spherical curvatures, wherein an intermediate image plane can be formed between said fourth imager lens and said fifth imager lens; and
    a sixth imager lens comprising a zinc selenide lens with an aspheric curvature on its first surface, and a spherical surface on the second surface.

6. The optical system according to claim 5, wherein said third imager lens is followed by a fold mirror in said imager to minimize the overall footprint of the optical system, and wherein a first pupil can be located at the aperture stop of the optical system, and a second pupil can be reimaged at a location of an exit pupil of said afocal arrangement to serve as an entrance pupil of said imager and/or minimize the size of said beam splitter without vignetting.

7. The optical system according to claim 1, wherein said beam splitter can be fixed to transmit the LWIR and reflect the MWIR, wherein the MWIR on-axis optical rays pass through the afocal arrangement, reflect off the beam splitter, and transmit through the imager to the image plane to form a MWIR image based on the focal length of the imager magnified by said afocal arrangement, and wherein the LWIR on-axis optical rays transmit through the beam splitter into the imager, and onto said common image plane where it forms an image based on the focal length of the imager, and wherein a focal plane array is configured to readout the spectral bands independently, whereby the optical system is capable of displaying two images at the same time.

8. An optical system for dual-band infrared use, comprising:

an afocal arrangement comprising an off-axis primary mirror that has a parabolic curvature and reflects a collimated light from across a field-of-view onto a secondary mirror, and a fold mirror followed by a tertiary mirror, wherein said secondary mirror reflects light onto said fold mirror, and wherein a light that is reflected from the tertiary mirror is collimated with a pupil diameter that is scaled by a magnification of said afocal arrangement;

an electrically switchable beam splitter from which said collimated light from said afocal arrangement can be switchably reflected, wherein said electrically switchable beam splitter is a spectrally selective liquid crystal device or an electro-chromic device electronically switchable to change its transmission properties such that two spectral bands can be switched between four path configurations, one being a common path;

a dual-band imager configured with respect to said electrically switchable beam splitter to image said two spectral bands of said common path onto a common image plane, wherein said dual-band imager comprises six various lenses that are configured to provide a common image plane and a focal length through said imager for MWIR and LWIR bands;

at least one of a plane parallel window and an aperture stop disposed in an optical path towards said common image plane; and a dual-band focal plane array capable of imaging said two spectral bands independently and simultaneously in relation to said common image plane, rendering said optical system suitable as a dual-band MWIR and LWIR system that simultaneously images both spectral bands as different fields of view, wherein said electrically switchable beam splitter is capable of switching spectral bands to render the said optical system suitable to image both spectral bands simultaneously with the same field of view.

9. The optical system according to claim 8, wherein said secondary mirror of said afocal arrangement is a hyperboloid, also an off-axis mirror, wherein said fold mirror is planar and has no power, and wherein said tertiary mirror is another off-axis paraboloid.

10. The optical system according to claim 8, wherein said afocal arrangement provides about 5.5 magnification ratio but is capable of providing a different magnification value to achieve a desired magnification change between the fields of view, and wherein an afocal exit pupil can be disposed in an air gap between the secondary mirror and the fold mirror after reflecting off of the tertiary mirror to reduce a footprint and/or avoid potential vignetting.

11. The optical system according to claim 8, wherein said six various lenses comprises:

a first imager lens comprising a zinc selenide lens that has an aspheric curvature on the first surface;

a second imager lens comprising a germanium lens with a spherical curvature on both surfaces;

a third imager lens comprising is a barium fluoride lens, also with spherical curvature on both sides;

a fourth imager lens comprising another germanium lens, this one having an aspheric curvature on its first surface, and a spherical curvature on the second surface;

a fifth imager lens comprising a barium fluoride lens with spherical curvatures, wherein an intermediate image plane can be formed between said fourth imager lens and said fifth imager lens; and a sixth imager lens comprising a zinc selenide lens with an aspheric curvature on its first surface, and a spherical surface on the second surface.

12. The optical system according to claim 8, wherein said electrically switchable beam splitter can be switched to transmit the LWIR and reflect the MWIR, wherein the MWIR on-axis optical rays pass through the afocal arrangement, reflect off the electrically switchable beam splitter, and transmit through the imager to the image plane to form a MWIR image based on the focal length of the imager magnified by said afocal arrangement, and wherein the LWIR on-axis optical rays transmit through the electrically switchable beam splitter into the imager, and onto said common image plane where it forms an image based on the focal length of the imager, and wherein a focal plane array is configured to readout the spectral bands independently, whereby the optical system is capable of displaying two images at the same time.

* * * * *